United States Patent [19]
Ito

[11] Patent Number: 6,121,615
[45] Date of Patent: *Sep. 19, 2000

[54] INFRARED RADIATION SENSITIVE DEVICE

[75] Inventor: Satoru Ito, Hakui, Japan

[73] Assignee: Murata Manufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/926,304

[22] Filed: Sep. 5, 1997

[30] Foreign Application Priority Data

Sep. 6, 1996 [JP] Japan .................................. 8-257434

[51] Int. Cl.$^7$ ........................................................ G01J 5/00
[52] U.S. Cl. ........................................................ 250/338.3
[58] Field of Search ........................................... 250/338.3

[56] References Cited

U.S. PATENT DOCUMENTS

| | | | |
|---|---|---|---|
| 3,733,499 | 5/1973 | Deis et al. | 250/338.3 |
| 3,842,276 | 10/1974 | Southgate | 250/338.3 |
| 3,932,753 | 1/1976 | Stotlar | 250/338.3 |

FOREIGN PATENT DOCUMENTS

| | | | |
|---|---|---|---|
| 0137529 | 4/1985 | European Pat. Off. . | |
| 58-66828 | 4/1983 | Japan | 250/338.3 |
| 62-123324 | 6/1987 | Japan | 250/338.3 |
| 8804475 | 6/1988 | WIPO . | |

OTHER PUBLICATIONS

Austrian Office Action dated Apr. 12, 1999.

*Primary Examiner*—Constantine Hannaher
*Assistant Examiner*—Albert Gagliardi
*Attorney, Agent, or Firm*—Ostrolenk, Faber, Gerb & Soffen, LLP

[57] ABSTRACT

A pyroelectric infrared sensor device (10) with improved relative detectivity and with which it is easier to change the relative detectivity, and also with reduced manufacturing cost. This sensor device (10) includes a pyroelectric unit (12) having an alternating lamination of internal electrodes (16) and pyroelectric layers (14) with a predetermined thickness t. The ends of the internal electrodes (16) which extend perpendicular to the length direction thereof are respectively exposed at alternate terminal surfaces of the pyroelectric unit (12) and external electrodes (18) are connected to the terminal ends of those internal electrodes (16), respectively. The pyroelectric infrared sensor device (10) is horizontally polarized between the internal electrodes (16) via the external electrodes (18) with respect to the infrared light receiving plane thereof. The ends of the internal electrodes (16) perpendicular to the width direction thereof are exposed at the top and bottom surfaces of the pyroelectric unit (12) in such a manner that its top surface side will act as the light receiving plane of the pyroelectric infrared sensor device (10).

6 Claims, 6 Drawing Sheets

INFRARED RADIATION SENSITIVE DEVICE

BACKGROUND OF THE INVENTION

1. Field of the Invention

The present invention relates to an infrared radiation sensitive device, and more particularly to an infrared radiation sensitive device comprising a pyroelectric unit, a light receiving face on said pyroelectric unit for receiving infrared light radiated from an object to be detected, and a pair of external electrodes on opposite end surfaces of said pyroelectric unit respectively.

2. Description of the Prior Art

One prior known pyroelectric infrared sensor device 1A is shown in FIG. 7A. This prior art device includes a rectangular-plate-shaped pyroelectric body 1a having top and bottom surfaces on which electrodes 2a, 3a are formed respectively with polarization treatment being applied between the electrodes 2a, 3a in the direction designated by the arrows shown in FIG. 7A. Another prior art pyroelectric infrared sensor device 1B is shown in FIG. 7B which includes a pyroelectric body 1b having side surfaces on both of which electrodes 2b, 3b are formed with polarization treatment being carried out between the electrodes 2b, 3b as indicated by the arrows in FIG. 7B. With these pyroelectric infrared sensor devices 1, the electrodes 2a, 3a and 2b, 3b are each formed in the direction perpendicular to the polarization direction as designated by the arrows.

In these prior art pyroelectric infrared sensor devices 1A and 1B, when infrared light rays 4 radiated from an object to be detected are incident on the light receiving plane of each pyroelectric infrared sensor device, a slight temperature change takes place in the respective pyroelectric body 1a, 1b. Such temperature change results in a packet of surface charge carriers in the pyroelectric body 1a, 1b, which carriers have been in the equilibrium condition, being forced to move, causing a corresponding voltage to be generated. This voltage is used to detect or sense the object being detected, by electrically amplifying the voltage with an associated impedance conversion circuit employing field effect transistors (FETs) and thereby converting the voltage into a corresponding electrical signal.

In order for such prior art pyroelectric infrared sensor devices to have improved relative detection rate or "detectivity" indicative of the pyroelectric device characteristics, it has been required that thermal insulation be attained by decreasing the thickness of the pyroelectric body per se while simultaneously causing the light receiving sections which are expected to receive incoming infrared light rays to be formed in a hollow shape. This allows the thermal or heat capacitance to decrease with the thermal time constant being decreased as low as possible thus improving the resultant relative detectivity.

Unfortunately, the aforesaid prior art pyroelectric infrared sensor devices encounter several difficulties, which follow. Since it has been strictly required to obtain thermal insulation while decreasing the thickness of the pyroelectric body, the mechanical strength of such pyroelectric body itself might be weakened so as to reduce its durability against application of thermal shocks, thereby making the handling of such pyroelectric infrared sensor devices difficult. In other words, if the pyroelectric body is decreased in thickness, then certain risks might arise: mechanical damage including micro-cracks can occur in the pyroelectric infrared sensor devices per se due to significant thermal variations upon application of external vibrations and shocks as well as upon irradiation of strong infrared light rays thereon, while the performance thereof can decrease due to degradation of heat flow balance. Furthermore, since the pyroelectric body per se becomes brittle, making it difficult for the pyroelectric body to be reliably supported by adhesion on a substrate, which in turn makes it very difficult both to settle its support method and to attain accurate position alignment accuracy. Due to the above difficulties the resulting performance can decrease undesirably.

Another problem faced by the prior art is that since in most cases the thickness of the pyroelectric body itself is designed to fall within the range of from 70 to 100 micrometers, the production yield remains low, rendering it extremely difficult to manufacture or fabricate the pyroelectric infrared sensor devices per se. This results in the manufacturing costs of the prior art pyroelectric infrared sensor devices being undesirably increased.

In a prior art approach to avoidance of the aforementioned problems, it is attempted to specifically arrange electrodes of a pyroelectric infrared sensor device so that polarization of a pyroelectric body thereof occurs only near a light incidence plane (a light receiving plane) of the device. One exemplary pyroelectric infrared sensor device 5 employing such a scheme is shown in FIG. 8. This structure comes in view of the fact that the contribution of the top surface of the light receiving plane occupies most part of an output of pyroelectric infrared sensor devices.

More specifically, the pyroelectric infrared sensor device 5 shown in FIG. 8 includes, for example, a rectangular plate-shaped pyroelectric body 6 having a top surface on which two opposed electrodes 7, 8 are formed with a certain distance D being defined therebetween. Polarization treatment has been effected by applying a direct current (DC) voltage between the two electrodes 7, 8. In this case, polarization is generated mainly at a section positionally close to the light incidence plane of the infrared light rays 9 with the polarization direction being parallel to the light incidence plane of the infrared light rays 9; in other words, the polarization direction is identical to the x-axis direction of FIG. 8.

Accordingly, this pyroelectric infrared sensor device 5 is superior to those shown in FIGS. 7A and 7B in that the polarization of its pyroelectric body 6 is restricted to being at or near the light incidence plane (light receiving plane) of the pyroelectric infrared sensor device 6, thereby improving the relative detectivity.

However, the above advantage of the prior art pyroelectric infrared sensor device 5 does not come without an accompanying penalty: a reduction in controllability of the relative detectivity. More specifically, in the prior art pyroelectric infrared sensor device 5, it should be required in order to change the relative detectivity, the light receiving area of the pyroelectric body 6 for receiving infrared light rays must be changed, which results in increasing complexity and time. For this reason, the prior art device is not adaptable for use in stable mass production while at the same time it is rendered difficult to manufacture the same at low cost.

SUMMARY OF THE INVENTION

It is therefore an object of the invention to provide a pyroelectric infrared sensor device having an improved relative detection rate and wherein the relative detection rate can be varied simply, while at the same time rendering mass production thereof easier and cheaper.

According to one aspect of the invention, a pyroelectric infrared sensor device may be characterized in that a pyroelectric unit comprises a plurality of pyroelectric layers, internal electrodes are respectively laid between adjacent pairs of said plurality of pyroelectric layers, edges of said internal electrodes are exposed and connected alternately to respective external electrodes at opposite end surfaces of said pyroelectric unit, said pyroelectric unit is electrically polarized between said internal electrodes, and edges of said internal electrodes are exposed at a light receiving face of said pyroelectric unit.

In the above pyroelectric infrared sensor device, since the internal electrodes are alternately disposed and laminated in the pyroelectric unit, each respective one of the pyroelectric layers is reduced in thickness so that such plurality of layers can be laminated, thereby increasing the electrode area of the opposing internal electrodes within the pyroelectric unit. Accordingly, any desired amount of electrical capacitance (electrostatic capacitance) can be attained as required to obtain a desired pyroelectric voltage level.

In other words, with the invention, since it employs a lamination structure made up of the pyroelectric layers and internal electrodes, it becomes possible to vary the magnitude of the electrical capacitance without having to change the light receiving area. The capacitance may be varied by, for example, increasing or decreasing the number of the laminated internal electrodes or alternatively by changing the area of the opposed internal electrodes. Consequently, the relative detection rate or "detectivity" of the pyroelectric infrared sensor device becomes variable.

Thus, in the above pyroelectric infrared sensor device, one way a relative detection ratio may be varied is by changing the area of said internal electrodes.

In such an arrangement, the area of internal electrodes may be varied in particular by changing the thickness of the pyroelectric unit. In this case, only the internal electrode area is changed, without also changing the area of the light receiving plane of the pyroelectric unit. Thus, the electrical capacitance between the opposed internal electrodes is varied inside the pyroelectric unit, causing a change in the relative detectivity of the pyroelectric infrared sensor device.

Also, in the above pyroelectric infrared sensor device, another way a relative detection ratio may be varied is by changing the number of said internal electrodes.

In this case, only the number of the internal electrode area is changed, without having to change the area of the light receiving plane of the pyroelectric unit.

According to another aspect of the invention, a method of manufacturing a pyroelectric infrared radiation detector device comprises the steps of:

1) preparing a plurality of pyroelectric sheets made of a pyroelectric material,
2) forming a pyroelectric unit with internal electrodes being exposed alternately at each opposite end surface thereof by alternately laminating said pyroelectric sheets and said internal electrodes,
3) baking said pyroelectric unit,
4) forming external electrodes on said opposite end surfaces of said pyroelectric unit so that said external electrodes are connected to said internal electrodes on each said opposite end surface of said pyroelectric unit,
5) polarizing said pyroelectric unit electrically between said internal electrodes via said external electrodes, and
6) cutting said pyroelectric unit and said external electrodes in a direction perpendicular to said internal electrodes in such a way that said internal electrodes are exposed at terminal ends thereof at the cut plane, wherein said cut plane acts as a light receiving face for receiving infrared light radiated from an object to be detected.

With such a method, the laminated pyroelectric unit is constituted by alternately disposing the plurality of pyroelectric sheets and internal electrodes. Also, the exposed ends of the internal electrodes are externally exposed at both end surfaces of the pyroelectric unit and connected to the external electrodes. The pyroelectric unit is polarized between the external electrodes. Further, the pyroelectric unit is cut away in the direction perpendicular to the internal electrode planes between the external electrodes. At this time, the exposed edges of the internal electrodes are exposed at the cut planes. The cut planes at which these internal electrodes are exposed are utilized as the light receiving plane onto which infrared light rays are incident, thereby obtaining the pyroelectric infrared sensor device.

In the above manufacturing method, the step of cutting said pyroelectric unit may further include a step of providing said internal electrodes with a desired area by predetermining a thickness of said pyroelectric unit being cut.

Advantageously, at the step of cutting the pyroelectric unit, the area of the internal electrodes is adjusted by changing the cutting thickness. Whereby, the electrical capacitance (electrostatic capacitance) of the opposed internal electrodes may be varied, permitting suitable variation of the magnitude of the relative detectivity of the pyroelectric infrared sensor device.

In accordance with the principles of the invention, it is possible to provide a pyroelectric infrared sensor device having improved relative detectivity, wherein the relative detectivity can be adjusted simply, and which can be stably manufactured at low cost without any degradation of its electrical characteristics.

These and other objects, features and advantages of the invention will be apparent from the following more particular description of embodiments of the invention, as illustrated in the accompanying drawings.

DETAILED DESCRIPTION OF EMBODIMENTS OF THE INVENTION

Figure 1:
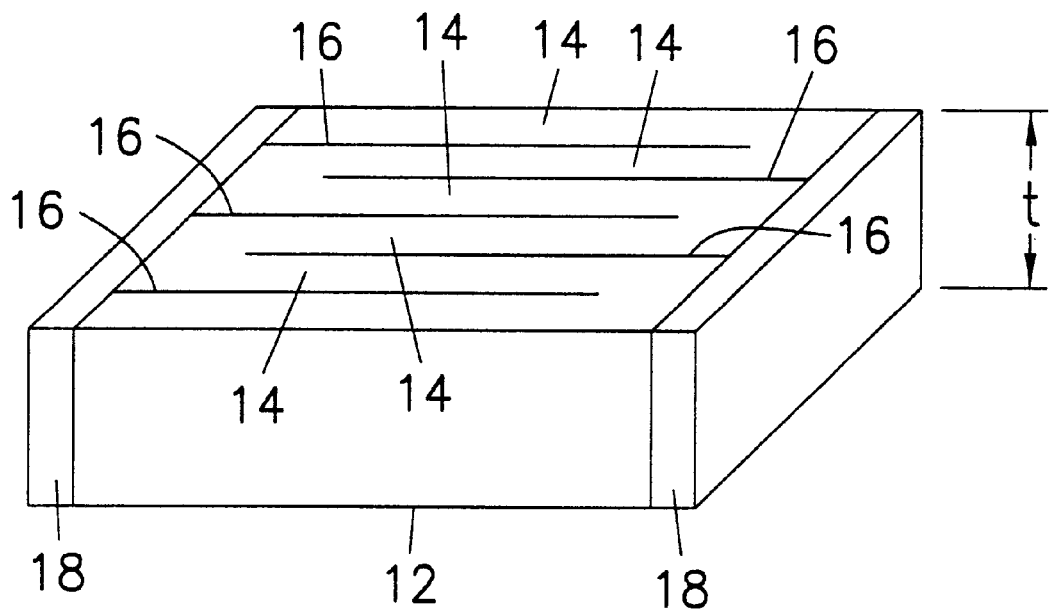
FIG. 1 is a perspective view of one embodiment of the present invention.

Referring now to FIG. 1, a pyroelectric infrared sensor device 10 includes a pyroelectric unit 12 which is of the planar rectangular shape and has a predefined thickness t. The pyroelectric unit 12 contains a plurality of pyroelectric layers 14, wherein rectangular plate-like internal electrodes 16 are formed between the pyroelectric layers 14, by way of example. In other words, the internal electrodes 16 are disposed within the pyroelectric unit 12 in such a manner that these are spaced apart at specified distances in the width direction thereof.

A first group of internal electrodes 16 extends from a first end of the pyroelectric unit 12 toward a second end thereof along the length direction thereof. A second group of internal electrodes 16 extends from the second end to the first end in such a way that the former and the latter are alternately formed. These internal electrodes 16 are formed such that respective terminal edges thereof are exposed alternately at the first end surface and the second end surface, said end surfaces extending perpendicular to the length of the pyroelectric unit 12.

Furthermore, external electrodes 18 are formed respectively on the first end surface and the second end surface of the pyroelectric unit 12 perpendicular to the length direction thereof and are connected to the adjacent terminal edges of the internal electrodes 16. In addition, the side edges of the internal electrodes 16 are exposed at the top and bottom surfaces of the pyroelectric unit 12 in the illustrative example. More specifically, the pyroelectric unit 12 is such that certain side edges of the internal electrodes 16 (wherein the internal electrodes extend in the thickness direction) are exposed at the top surface of pyroelectric unit 12, whereas the opposite side edges of the internal electrodes 16 are exposed at the bottom surface.

In the pyroelectric infrared sensor device 10 in accordance with this embodiment, the top surface of the pyroelectric unit 12 on which the certain side edges of the internal electrodes 16 are exposed is utilizable as what is called the "infrared light receiving plane" for incidence of infrared light rays. In this pyroelectric infrared sensor device 10, polarization treatment has been effected between the internal electrodes 16 by application of a DC voltage via the two opposite external electrodes 18. In other words, in this pyroelectric infrared sensor device 10, the polarization treatment has been done in the horizontal direction which extends parallel to its infrared light receiving plane.

An explanation will now be given of one exemplary method of manufacturing the pyroelectric infrared sensor device 10 of FIG. 1 with reference to FIGS. 2A to 2F.

Figure 2A:
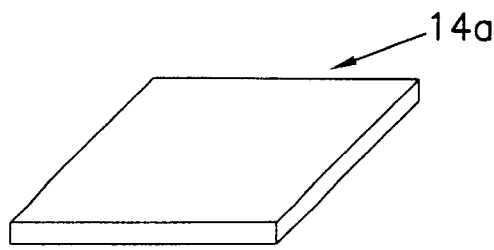
FIGS. 2A to 2F illustrate, in perspective view, some of the major steps in the manufacture of the pyroelectric infrared sensor device shown in FIG. 1.

To fabricate the pyroelectric infrared sensor device 10 shown in FIG. 1, first of all, a pyroelectric ceramic body measuring 50 to 100 mm in thickness, for example, is prepared, which is then subjected to lapping treatment to have a predetermined shape. When this is done, as shown in FIG. 2A, a pyroelectric ceramic sheet 14a for constituting one pyroelectric layer 14 is manufactured which is of a planar rectangular shape and has a predefined size. Similarly, a plurality of additional pyroelectric ceramic sheets 14a are prepared. Tetragonal-system lead titanate ceramics may be preferably employed as the material thereof.

Then, a conductive pattern 16a which is made of an electrode material acting as the internal electrode 16 is formed by a printing technique such as screen printing on a respective one of the plurality of pyroelectric ceramic sheets 14a. In this embodiment, as shown in FIG. 2B, electrode patterns 16a are respectively formed on the pyroelectric ceramic sheets 14a corresponding to intermediate layers except the uppermost and lowermost ones of the pyroelectric layers 14. These electrode patterns 16a are formed in such a manner that their edges are alternately exposed at the terminal ends of the pyroelectric ceramic sheets 14a, namely at the end edges which extend perpendicular to the length direction thereof. Typically, gold (Au), silver (Ag), aluminum (Al) or the like is preferably employed as the electrode material for use as the internal electrodes 16; however, alloys made of nickel (Ni), chromium (Cr) or the like may alternatively be used for formation of the same.

Figure 2C:
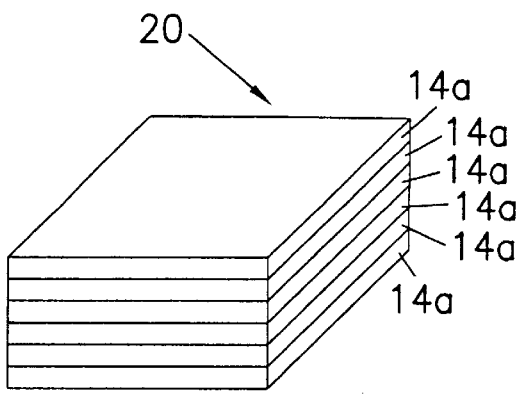
Figure 2B:
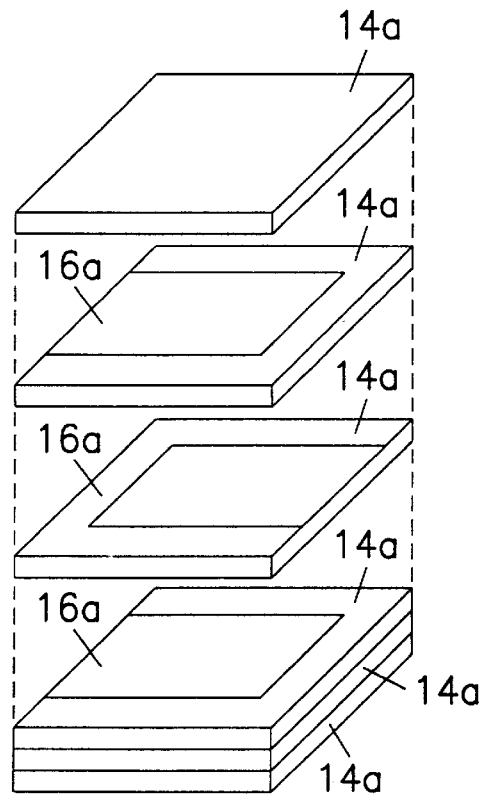

Next, these pyroelectric ceramic sheets 14a are laminated and adhered securely together by use of an adhesive forming a multilayer laminated structure 20 of pyroelectric ceramics as shown in FIG. 2C. Note that the laminated structure 20 may alternatively be formed by a method including the steps of laminating the pyroelectric ceramic sheets 14a and adhering them together by a baking process.

Figure 2D:
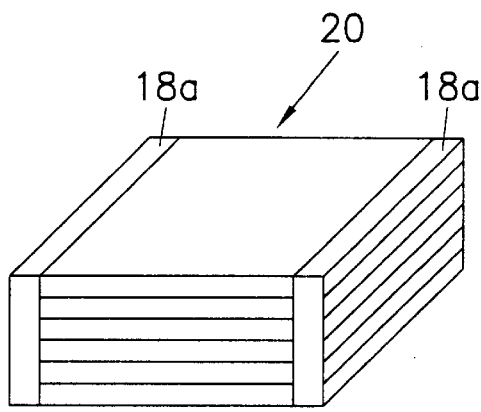

Furthermore, metal paste (not shown) is deposited on the opposite end surfaces of this pyroelectric ceramic laminated structure 20 perpendicular to the length direction thereof, which paste is made of a chosen electrode material to constitute the external electrodes 18. Thereafter, this laminated structure 20 is baked for hardening, whereby, as shown in FIG. 2D, external electrodes 18a are formed on both end surfaces of the structure 20 perpendicular to the length direction thereof.

The pyroelectric ceramic laminated structure 20 is then subjected to polarization treatment for polarizing the pyroelectric layers 14 between the internal electrodes 16a via the opposite external electrodes 18a. In this case, a DC voltage of for example from 2.0 to 4.0 kilovolts per millimeter (KV/mm) is applied between the external electrodes 18a for sixty (60) minutes at temperatures of 100 to 150° C.

Figure 2F:
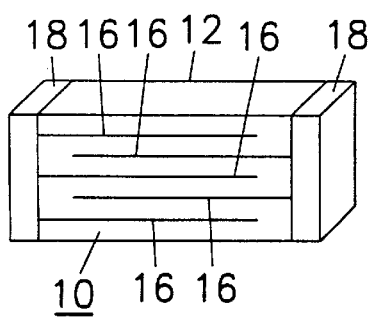
Figure 2E:
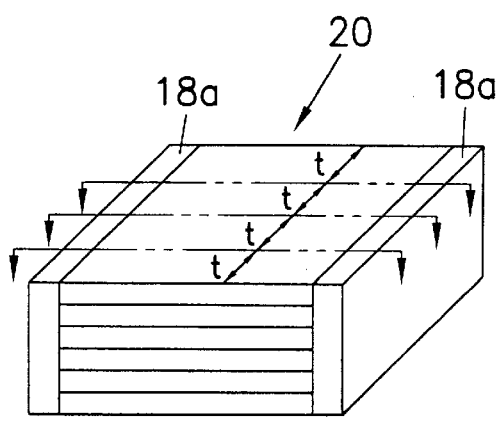

Thereafter, as shown by dash-and-two-dot lines in FIG. 2E, the pyroelectric ceramic laminated structure 20 is cut away at cut lines spaced apart by a predetermined thickness t perpendicular to the plane of the internal electrodes 16, thus forming a plurality of pyroelectric units 12 each of which may be identical to that shown in FIG. 1 and FIG. 2F.

Note that the manufacturing method of the pyroelectric infrared sensor device 10 should not be exclusively limited to the above embodiment only. An alternative manufacturing method for the pyroelectric infrared sensor device 10 will be set forth below.

First, a base material sheet is prepared which is made of a pyroelectric ceramic green sheet. This base material sheet is formed to a thin-film sheet member (thin plate shape) measuring, for example, 30 to 80 micrometers in thickness by pyroelectric material slurrying. The base-material sheet is suitably cut into a specified shape thus forming a plurality of pyroelectric sheets.

Next, electrode patterns made of a chosen electrode material are formed by print techniques for example on the pyroelectric sheets in the same fabrication method as that discussed previously. These pyroelectric sheets are laminated by solderless contact bonding on one another and disposed in an arrangement similar to that of the aforesaid fabrication method; then the resultant structure is baked, thereby providing one integral pyroelectric sheet laminated structure.

Further, external electrodes made of an electrode material are formed on both end surfaces of the pyroelectric sheet laminated structure. Next, polarization treatment is carried out between the external electrodes in a way similar to that of the fabrication method stated supra.

Thereafter, the pyroelectric sheet lamination structure is cut at a specified thickness in the direction perpendicular to the principal plane of the internal electrodes, thereby fabricating a pyroelectric unit 12.

The pyroelectric unit 12 thus fabricated by either of the foregoing manufacturing methods is such that the terminal edges of the internal electrodes 16, which were laminated and disposed with certain intervals therebetween, are exposed on the opposite terminal surfaces of pyroelectric unit 12, which terminal surfaces extend perpendicular the length thereof, and the external electrodes 18 are connected to the internal electrodes 16. Moreover, the side edges of such internal electrodes 16 are exposed at the top and bottom surfaces of the pyroelectric unit 12 in the illustrative embodiment. In this embodiment, the top surface serves as the infrared light receiving plane. The pyroelectric unit 12 as fabricated in this way is adaptable for use with infrared light sensor modules.

Figure 3:
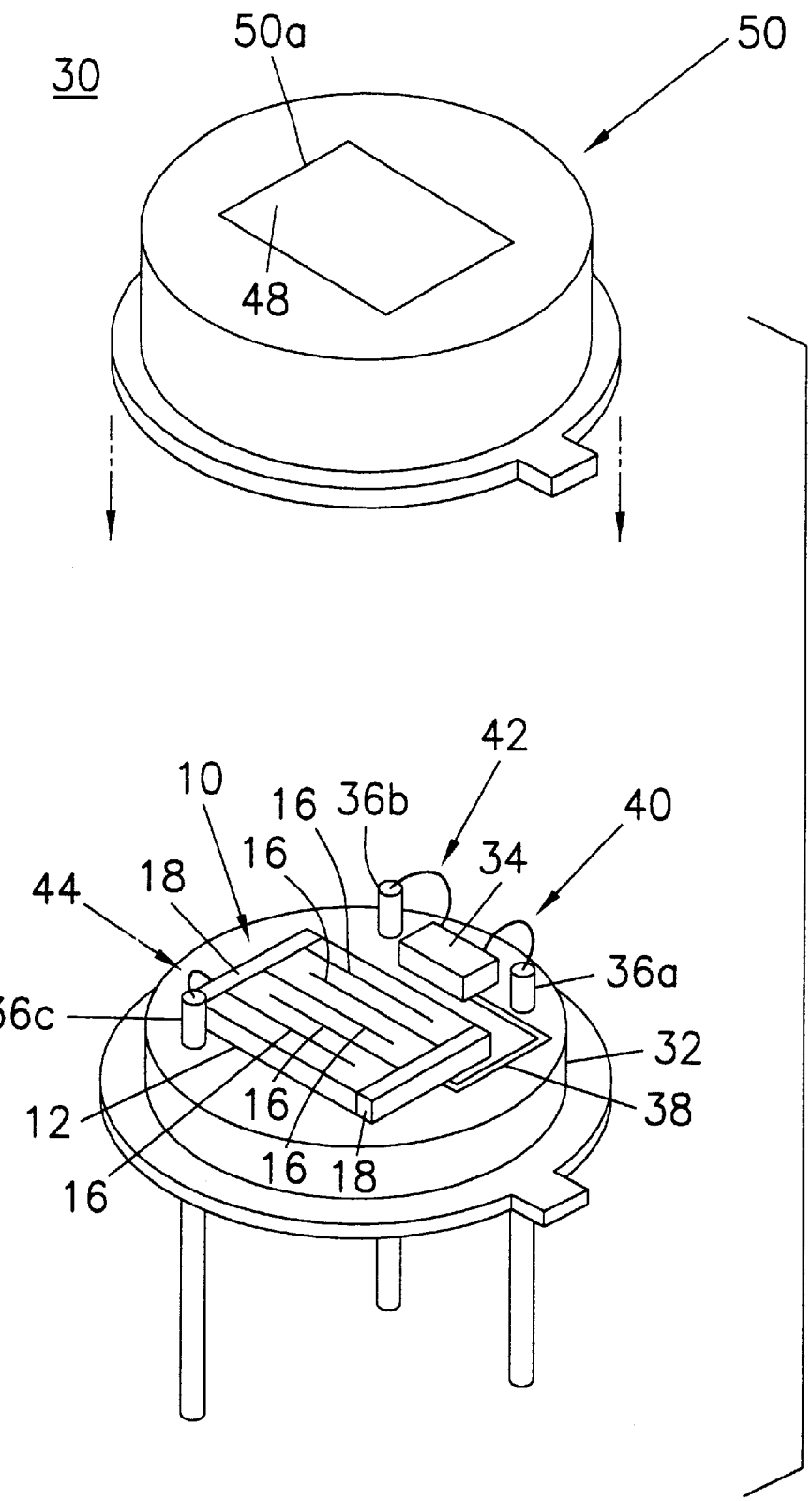
FIG. 3 is an exploded perspective view of one exemplary sensor structure employing the pyroelectric infrared sensor device of FIGS. 1 and 2.

Turning now to FIG. 3, a pyroelectric infrared sensor module 30 in accordance with one possible example employing the pyroelectric infrared sensor devices shown in FIGS. 1 and 2 includes a stem 32. The pyroelectric infrared sensor device 10 discussed supra is disposed on the stem 32. Also disposed on the stem 32 is a field effect transistor (FET) 34 which is spaced apart from the pyroelectric infrared sensor device 10 with a certain distance being defined therebetween. Further disposed on the stem 32 are terminal pins 36a, 36b and 36c for electrical interconnection.

The gate terminal of FET 34 is connected to one external electrode 18 through an electrode pattern 38, by way of example. The drain terminal of FET 34 is connected via a conductive wire 40 to the terminal pin 36a. The source terminal of FET 34 is connected via a conductive wire 42 to the terminal pin 36b. The terminal pin 36c is used as the ground terminal, which is connected via a conductive wire 44 to the other external electrode 18 of the pyroelectric infrared sensor device 10.

Figure 4:
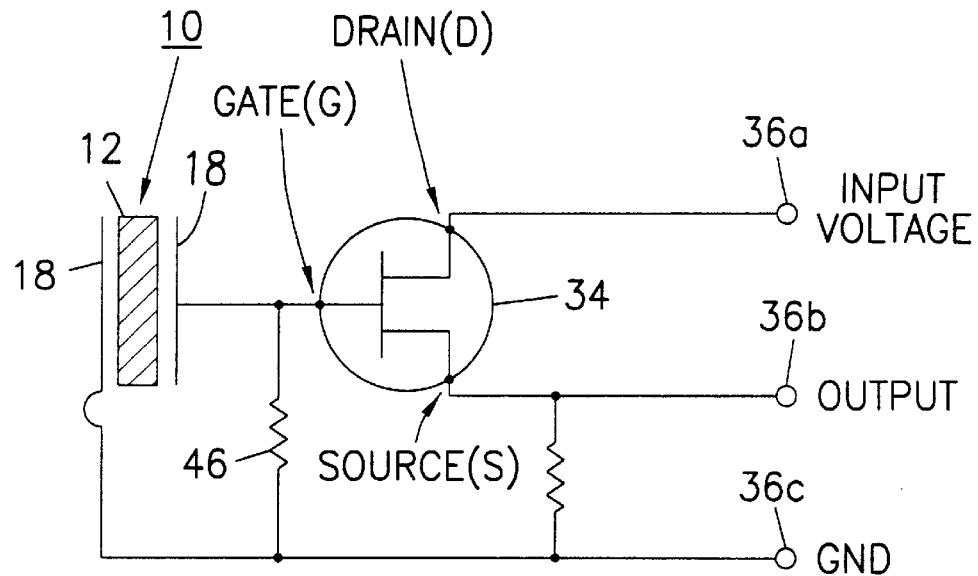
FIG. 4 is a circuit diagram showing an example of an electrical circuit in the pyroelectric infrared sensor shown in FIG. 3.

As may be readily seen by those skilled in the art from viewing FIG. 4, a resistor 46 for conversion of a pyroelectric current into a corresponding voltage is connected in parallel to the pyroelectric infrared sensor device 10. Note here that a chip component may be employed as this resistor 46, or alternatively, such resistor 46 may be formed of a resistive pattern printed on the stem 32.

An associated can casing 50 has the shape of a square bracket (]) in cross-section. The can casing 50 has a top plate or "ceiling" with a rectangular through-going hole 50a being defined at the center thereof. An optical filter 48 is rigidly attached to the inner surface of the ceiling plate of casing 50 to ensure that filter 48 overlies the pyroelectric infrared sensor device 10 mounted on the substrate, thus enabling sensor device 10 to receive incoming rays of infrared light radiated from a target object being detected through filter 48. The can casing 50 is adhered to the stem 32. The interior space as defined by the assembled optical filter 48, can casing 50 and stem 32 may be environmentally sealed.

The pyroelectric infrared sensor 30 of FIG. 3 may have an electrical equivalent circuit as shown in FIG. 4. In this pyroelectric infrared sensor module 30, when thermal energy is given upon incidence of infrared light rays onto the top surface (light receiving plane) of the pyroelectric infrared sensor device 10, some pyroelectric current occurs in the pyroelectric infrared sensor device 10. This pyroelectric current may be obtained as a voltage by use of the combination of the resistance of the resistor 46 and the inherent electrical resistance of the sensor device 10 per se. This voltage is input to the gate terminal of FET 34. At this time, a bias voltage is applied to the drain terminal of FET 34 while the source terminal of FET 34 is coupled to ground.

Accordingly, the resultant pyroelectric current in the pyroelectric infrared sensor device 10 is impedance-converted by a combination of the pyroelectric infrared sensor device 10, resistor 46 and FET 34 into an output voltage which is derived from the terminal pin 36b.

With this pyroelectric infrared sensor 30, if the pyroelectric infrared sensor device 10 is formed using the manufacturing method shown in FIG. 2, the internal electrodes 16 are disposed so as to oppose each other perpendicular to the width direction of the pyroelectric unit 12 and the pyroelectric unit 12 is polarized in the horizontal direction with respect to the infrared light receiving plane thereof. For this reason, a pyroelectric infrared sensor device 10 is obtained which no longer depends upon the thickness direction of the pyroelectric body, unlike the prior art devices including those shown in FIGS. 7 and 8.

Further, the pyroelectric infrared sensor device 10 is specifically arranged to have the alternate lamination structure of pyroelectric layers 14 and internal electrodes 16. In this case, each of the pyroelectric layers 14 is decreased in thickness while allowing opposed internal electrodes 16 in the pyroelectric unit 12 to increase in electrode area as a result of the lamination of multiple layers. Consequently, an electrical capacitance (electrostatic capacitance) can be obtained as required for attainment of an intended pyroelectric voltage.

Furthermore, due to the lamination structure of the pyroelectric layers 14 and the internal electrodes 16, this pyroelectric infrared sensor 30 may also be enhanced in its polarizability, which in turn leads to an improvement in its sensitivity.

Yet further, with this pyroelectric infrared sensor device 10, it becomes possible to render variable the magnitude of the electrical capacitance by increasing/decreasing the lamination number of the internal electrodes 16 and/or by changing the area of opposed internal electrodes 16. Accordingly, it is possible to render variable the relative detectivity of the pyroelectric infrared sensor device 10.

In this embodiment, the area of the internal electrodes 16 may be changed, during the manufacturing process of the pyroelectric infrared sensor device 10, by changing the thickness of the pyroelectric unit 12; namely, by increasing or decreasing the spacing t of the cutting lines, in the cutting step shown in FIG. 2E.

In this embodiment it is possible, by causing the electrode area of the internal electrodes 16 to increase proportionally to the cut width t, to change only the area of internal electrodes 16 without having to change the area of the light receiving plane of the pyroelectric infrared sensor device 10. Therefore, the electrical capacitance can be changed likewise. In this case, a packet of charge carriers as produced from the top surface (light receiving plane) of the pyroelectric infrared sensor device 10 is proportional to the light receiving area thereof, while its output voltage is inversely proportional to the electrical capacitance. It is thus possible to suitably adjust an output voltage of this pyroelectric infrared sensor device 10 by rendering variable the magnitude of the electrical capacitance.

In this case, white noise components will vary with certain frequency as determined by the electrical capacitance of the internal electrodes 16 laminated to oppose each other in the pyroelectric unit 12 and the output impedance of the pyroelectric infrared sensor device 10. Therefore, it is also possible to render variable the relative detectivity of the pyroelectric infrared sensor device 10 by changing this electrical capacitance.

Figure 7A:
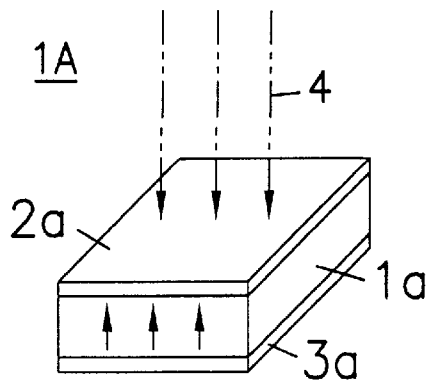
FIGS. 7A–7B are perspective views illustrating prior art pyroelectric infrared sensor devices.
Figure 7B:
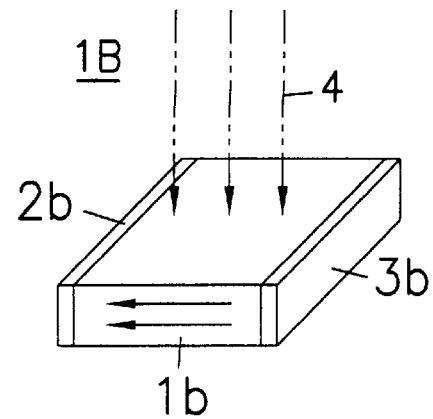
Figure 8:
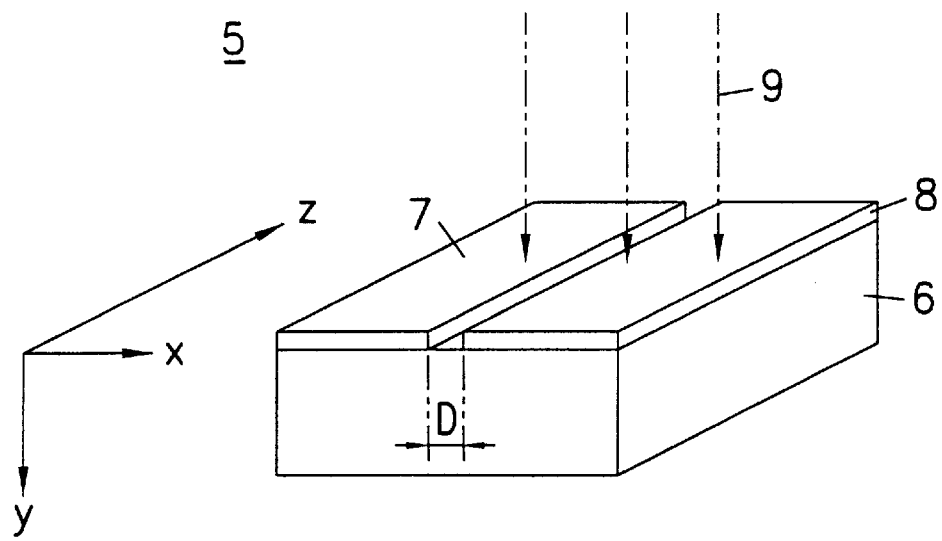
FIG. 8 is a perspective view of a further prior art pyroelectric infrared sensor device.

Furthermore, if this pyroelectric infrared sensor device 10 is fabricated by the manufacturing method as discussed supra in connection with FIG. 2, it is no longer required to render the pyroelectric body thinner, unlike the prior art sensor devices 1, 5 shown in FIGS. 7 and 8. For this reason, the sensor device 10 shown in FIGS. 1 and 2 has improved mechanical and thermal strength, which eliminates the possibility of a decrease in its electrical characteristics otherwise occurring due to these factors. It is also possible for this device 10 to form a leakage resistance using the pyroelectric body by itself.

A further advantage of this pyroelectric infrared sensor device 10 is that the support methods and heat insulation schemes that must be employed in the conventional devices 1, 5 of FIGS. 7 and 8 are no longer required, which may in turn enable simple formation of the infrared light receiving plane. Therefore, use of this pyroelectric infrared sensor device 10 may increase the production yield while simultaneously reducing complexity and cost of the manufacture thereof.

It may be appreciated by those skilled in the art from the foregoing description that with the pyroelectric infrared sensor device 10 in accordance with this embodiment, it becomes possible to improve the relative detectivity while easily enabling the relative detectivity to be variable. In addition, it is also possible to render the manufacture of the same stable while reducing manufacturing costs without having to degrade the electrical characteristics thereof.

Furthermore, with the pyroelectric infrared sensor device 10, since the plurality of internal electrodes 16 which are disposed or "sandwiched" between the plurality of pyroelectric layers 14 within the pyroelectric unit 12 are electrically connected in parallel, it becomes possible to further decrease the entire dielectric resistance of the pyroelectric infrared sensor device 10. In this case, the dielectric resistance may typically measure $10^{11}$ ohms; this dielectric resistance value may be dropped down at or near $10^9$ ohms when one hundred (100) layers are laminated.

Figure 5:
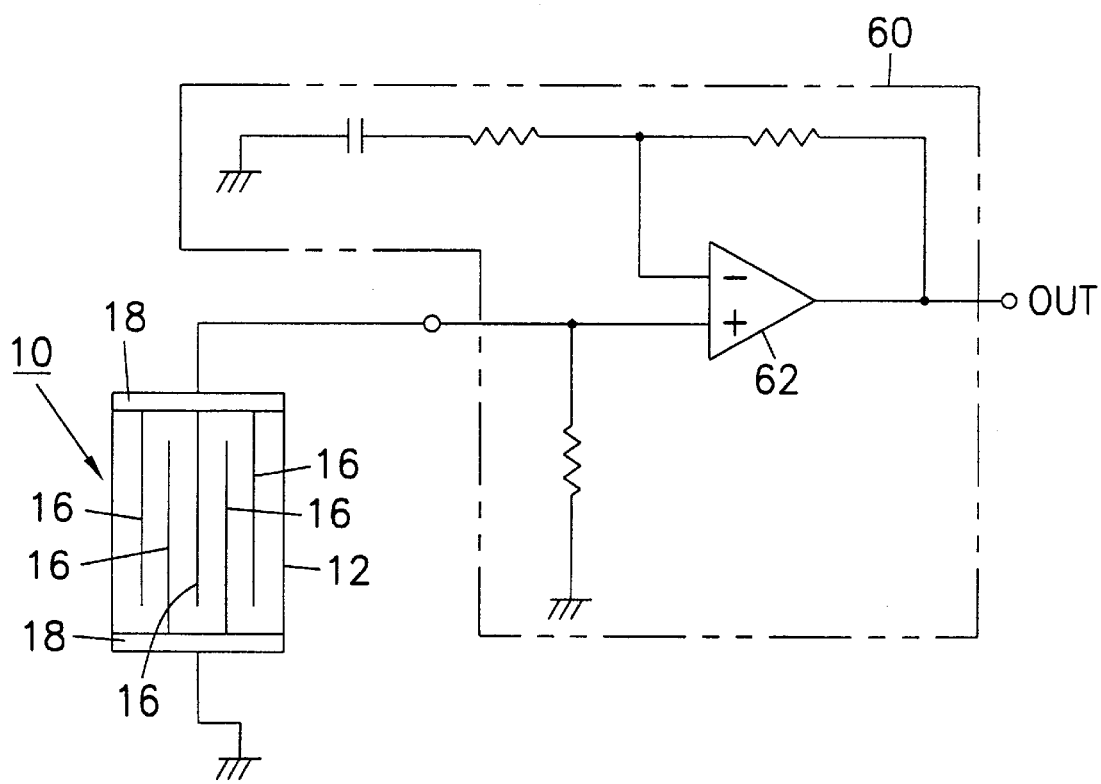
FIG. 5 is a circuit diagram showing another example of an electrical circuit in the pyroelectric infrared sensor of FIG. 3, employing therein the pyroelectric infrared sensor device of FIGS. 1 and 2.

As a consequence, use of the impedance converter circuit employing FET 34 is no longer required as in the pyroelectric infrared sensor 30 shown in FIG. 3. The device 10 can thus be directly connected to an amplifier circuit 60 including therein an operational amplifier 62 as shown in FIG. 5. In this case, the non-inverting input terminal of operational amplifier 62 is connected to one external electrode 18 of the pyroelectric infrared sensor device 10 allowing an electrical signal to be sent forth from the pyroelectric infrared sensor device 10 at a low resistance, which signal is then amplified by the amplifier circuit 60 to be output from an output terminal of the operational amplifier 62.

Figure 6:
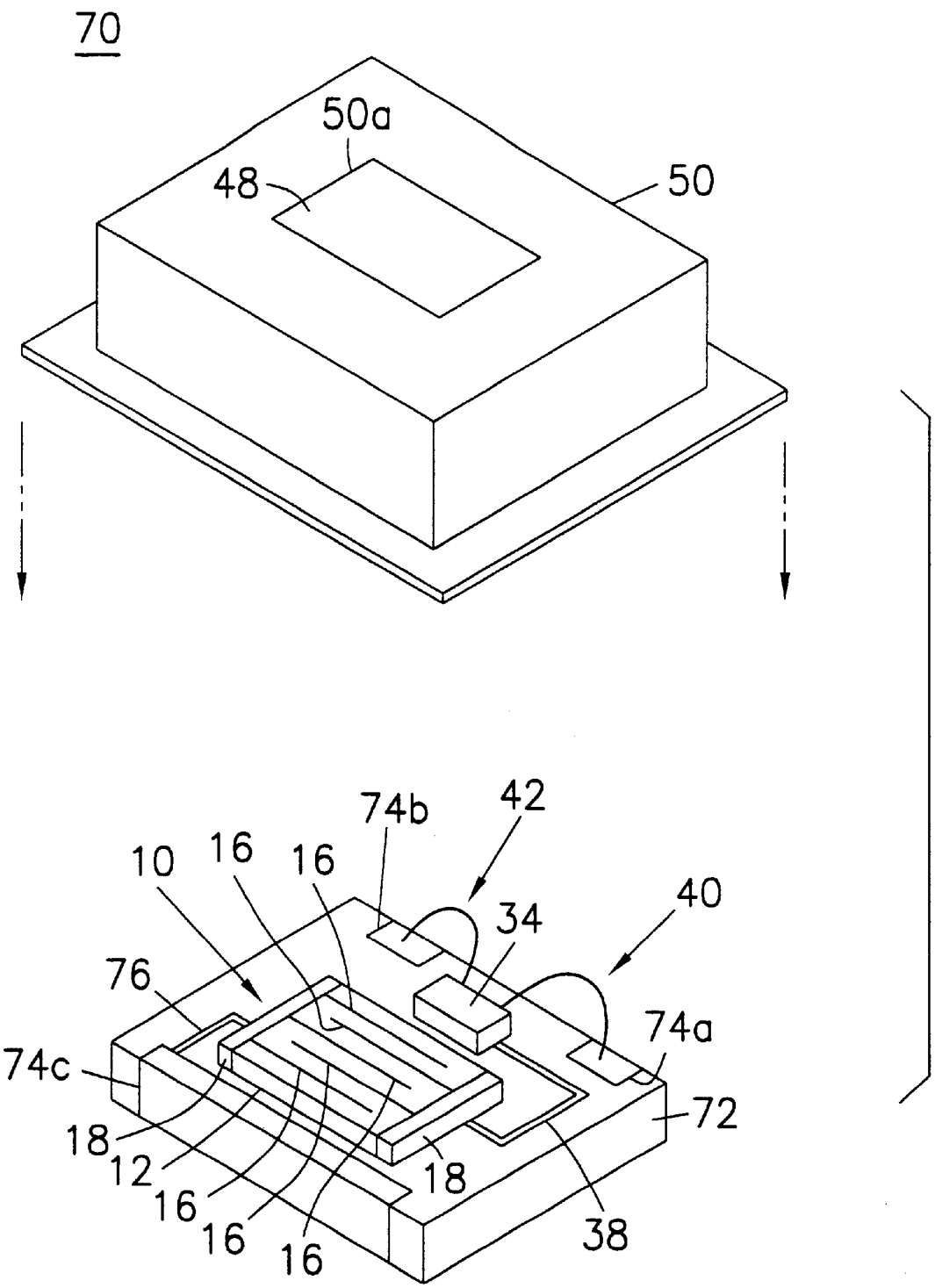
FIG. 6 is an exploded perspective view of a further exemplary sensor structure employing the pyroelectric infrared sensor device of FIGS. 1 and 2.

It should be noted that while the pyroelectric infrared sensor device 10 is usable in a pyroelectric infrared sensor 30 with a structure of the hermetic seal type as exemplarily shown in FIG. 3, the same may also be used in a pyroelectric infrared sensor 70 with a surface mount type structure as shown in FIG. 6.

More specifically, in the pyroelectric infrared sensor 70 shown in FIG. 6, as compared with the pyroelectric infrared sensor 30 of FIG. 3, the pyroelectric infrared sensor device 10 is in particular supported on a dielectric substrate 72 made of alumina, for example, with spaced-apart electrode patterns 74*a* and 74*b* formed at a certain distance on one side surface of the dielectric substrate 72 perpendicular to the width direction thereof. In addition, an electrode pattern 74*c* is formed as the ground terminal on the opposite side surface of the dielectric substrate 72. The drain terminal of FET 34 is connected via a conductive wire 40 to the electrode pattern 74*a*. Also, the source terminal of FET 34 is connected via conductive wire 42 to the electrode pattern 74*b*. Further, the other external electrode 18 of the pyroelectric infrared sensor device 10 is connected via a conductive pattern 76 to the electrode pattern 74*c*. Note in FIG. 6 that the same parts or components as those of the embodiment of FIG. 3 designated by the same reference characters are identical or similar in structure thereto.

Although the embodiments of the invention have been disclosed herein, the scope of the invention is not so limited, but rather extends to such modifications and variations and other embodiments that may occur to one having ordinary skill in the pertinent art.

What is claimed is:

1. An infrared radiation sensitive device comprising:

a pyroelectric unit having a parallelepiped shape including first and second opposed major surfaces separated by at least first and second side surfaces extending there between, one of said major surfaces being a planar light receiving surface having a length and a width, a thickness of said pyroelectric unit as measured between said first and second major surfaces being smaller than said length and width of said major surfaces, said pyroelectric unit including a plurality of pyroelectric layers separated by respective planar internal electrodes which extend parallel to one another and generally perpendicular to said light receiving surface, edges o f said internal electrodes alternatively extending to said first or said second side surfaces, said pyroelectric layers being polarized in a direction extending parallel to both said planar light receiving surface and said planar internal electrodes;

a first electrode located on said first side surface of said pyroelectric unit and being electrically coupled to those said internal electrodes which extend to said first side surface; and a second external electrode located on said second side surface of said pyroelectric unit and being electrically coupled to those said internal electrodes which extend to said second side surface.

2. The infrared radiation sensitive device of claim 1, wherein edges of at least some of said internal electrodes extend to and are exposed at said light receiving face.

3. The infrared radiation sensitive device of claim 1, wherein edges of all of said internal electrodes extend to and are exposed at said light receiving face.

4. A method for adjusting the relative detection ratio of an infrared radiation sensitive device of the type which includes a pyroelectric unit comprising a plurality of pyroelectric layers separated by respective planar internal electrodes which extend parallel to one another, said pyroelectric unit having a planar light receiving face extending perpendicular to the planes of said internal electrodes and first and second opposing end faces which extend in a direction perpendicular to said light receiving face by a distance that is smaller than the largest dimension of said light receiving face, edges of said internal electrodes alternatively extending to said first or said second end face, said pyroelectric layers being polarized in a direction extending parallel to both said planar light receiving face and said planar internal electrodes; and first and second external electrodes located on said first and second end faces of said pyroelectric unit and being electrically coupled to those internal electrodes whose end face extend to said first and second end face, respectively; said method comprising:

determining a desired relative detection ratio; and selecting the surface area of said internal electrodes to achieve said relative detection ratio.

5. The method of claim 4, further including the step of selecting the number of internal electrodes to achieve a desired relative detection ratio.

6. An infrared radiation sensitive device comprising:

a pyroelectric unit having a parallelepiped shape including first and second opposed major surfaces separated by at least first and second side surfaces extending there between, one of said major surfaces being a planar light receiving surface having a length and a width, a thickness of said pyroelectric unit as measured between said first and second major surfaces being smaller than said length and width of said major surfaces, said pyroelectric unit including a plurality of pyroelectric layers separated by respective planar internal electrodes which extend parallel to one another and generally perpendicular to said light receiving surface, edges o f said internal electrodes alternatively extending to said first or said second side surfaces, said pyroelectric layers being polarized in a direction extending parallel to both said planar light receiving surface and said planar internal electrodes;

a first electrode located on said first side surface of said pyroelectric unit and being electrically coupled to those said internal electrodes which extend to said first side surface; and a second external electrode located on said second side surface of said pyroelectric unit and being electrically coupled to those said internal electrodes which extend to said second side surface.

* * * * *